United States Patent
Chen et al.

(10) Patent No.: US 10,510,730 B2
(45) Date of Patent: Dec. 17, 2019

(54) STACKED SEMICONDUCTOR STRUCTURE AND METHOD

(71) Applicant: Taiwan Semiconductor Manufacturing Company, Ltd., Hsinchu (TW)

(72) Inventors: Szu-Ying Chen, Toufen Township (TW); Meng-Hsun Wan, Taipei (TW); Dun-Nian Yaung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/221,734

(22) Filed: Dec. 17, 2018

(65) Prior Publication Data

US 2019/0123026 A1 Apr. 25, 2019

Related U.S. Application Data

(60) Continuation of application No. 15/657,630, filed on Jul. 24, 2017, now Pat. No. 10,157,889, which is a (Continued)

(51) Int. Cl.
*H01L 25/065* (2006.01)
*H01L 23/00* (2006.01)
*H01L 25/00* (2006.01)

(52) U.S. Cl.
CPC .......... *H01L 25/0657* (2013.01); *H01L 24/03* (2013.01); *H01L 24/05* (2013.01); *H01L 24/06* (2013.01); *H01L 24/08* (2013.01); *H01L 24/80* (2013.01); *H01L 25/50* (2013.01); *H01L 2224/033* (2013.01); *H01L 2224/03019* (2013.01); *H01L 2224/0384* (2013.01); *H01L 2224/03452* (2013.01); *H01L 2224/03462* (2013.01); *H01L 2224/03464* (2013.01); *H01L 2224/03616* (2013.01); *H01L 2224/03848* (2013.01); *H01L 2224/04105* (2013.01); *H01L 2224/05184* (2013.01); *H01L 2224/05546* (2013.01); *H01L 2224/05624* (2013.01); *H01L 2224/05639* (2013.01); *H01L 2224/05647* (2013.01); *H01L 2224/05666* (2013.01);
(Continued)

(58) Field of Classification Search
CPC ..... H01L 25/0657; H01L 24/05; H01L 24/08; H01L 24/03; H01L 24/06; H01L 25/50; H01L 24/01–09; H01L 24/80–82
See application file for complete search history.

(56) References Cited

U.S. PATENT DOCUMENTS

| 7,943,428 B2 | 5/2011 | Gambino et al. |
| 2007/0086166 A1* | 4/2007 | Kurita ................. H01L 21/4853 361/704 |

(Continued)

*Primary Examiner* — Sonya D. McCall-Shepard
(74) *Attorney, Agent, or Firm* — Slater Matsil, LLP

(57) ABSTRACT

A device comprises a first chip comprising a first connection pad embedded in a first dielectric layer and a first bonding pad embedded in the first dielectric layer, wherein the first bonding pad comprises a first portion and a second portion, the second portion being in contact with the first connection pad and a second chip comprising a second bonding pad embedded in a second dielectric layer of the second chip, wherein the first chip and the second chip are face-to-face bonded together through the first bonding pad the second bonding pad.

20 Claims, 13 Drawing Sheets

Related U.S. Application Data continuation of application No. 15/018,490, filed on Feb. 8, 2016, now Pat. No. 9,716,078, which is a division of application No. 14/250,024, filed on Apr. 10, 2014, now Pat. No. 9,257,414.

(52) U.S. Cl.
CPC .............. *H01L 2224/06181* (2013.01); *H01L 2224/08058* (2013.01); *H01L 2224/08145* (2013.01); *H01L 2224/8083* (2013.01); *H01L 2224/80357* (2013.01); *H01L 2224/80895* (2013.01); *H01L 2224/80896* (2013.01); *H01L 2224/80948* (2013.01); *H01L 2224/80986* (2013.01); *H01L 2224/9202* (2013.01); *H01L 2225/06548* (2013.01); *H01L 2924/01029* (2013.01); *H01L 2924/01074* (2013.01)

(56) References Cited

U.S. PATENT DOCUMENTS

| | | |
|---|---|---|
| 2008/0142990 A1 | 6/2008 | Yu et al. |
| 2013/0249075 A1 | 9/2013 | Tateiwa et al. |
| 2015/0021785 A1 | 1/2015 | Lin |

\* cited by examiner

STACKED SEMICONDUCTOR STRUCTURE AND METHOD

This application is a continuation of U.S. patent application Ser. No. 15/657,630, entitled "Stacked Semiconductor Structure and Method," filed on Jul. 24, 2017, which is a continuation of U.S. patent application Ser. No. 15/018,490, entitled "Stacked Semiconductor Structure and Method," filed on Feb. 8, 2016, now U.S. Pat. No. 9,716,078 issued Jul. 25, 2017, which is a divisional of U.S. patent application Ser. No. 14/250,024, entitled "Stacked Semiconductor Structure and Method," filed on Apr. 10, 2014, now U.S. Pat. No. 9,257,414 issued Feb. 9, 2016, which applications are incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, three-dimensional (3D) integrated circuits (ICs) have emerged as an effective alternative to further reduce the physical size of a semiconductor chip. A 3D IC may comprise a variety of semiconductor dies stacked together. In particular, the semiconductor dies may be bonded together through a plurality of micro bumps and electrically coupled to each other through a plurality of through vias. For example, active circuits such as logic, memory, processor circuits and the like are fabricated on different wafers and each wafer die is stacked on top of another wafer die using pick-and-place techniques. Through vias are thus used in the stacked dies for connecting dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
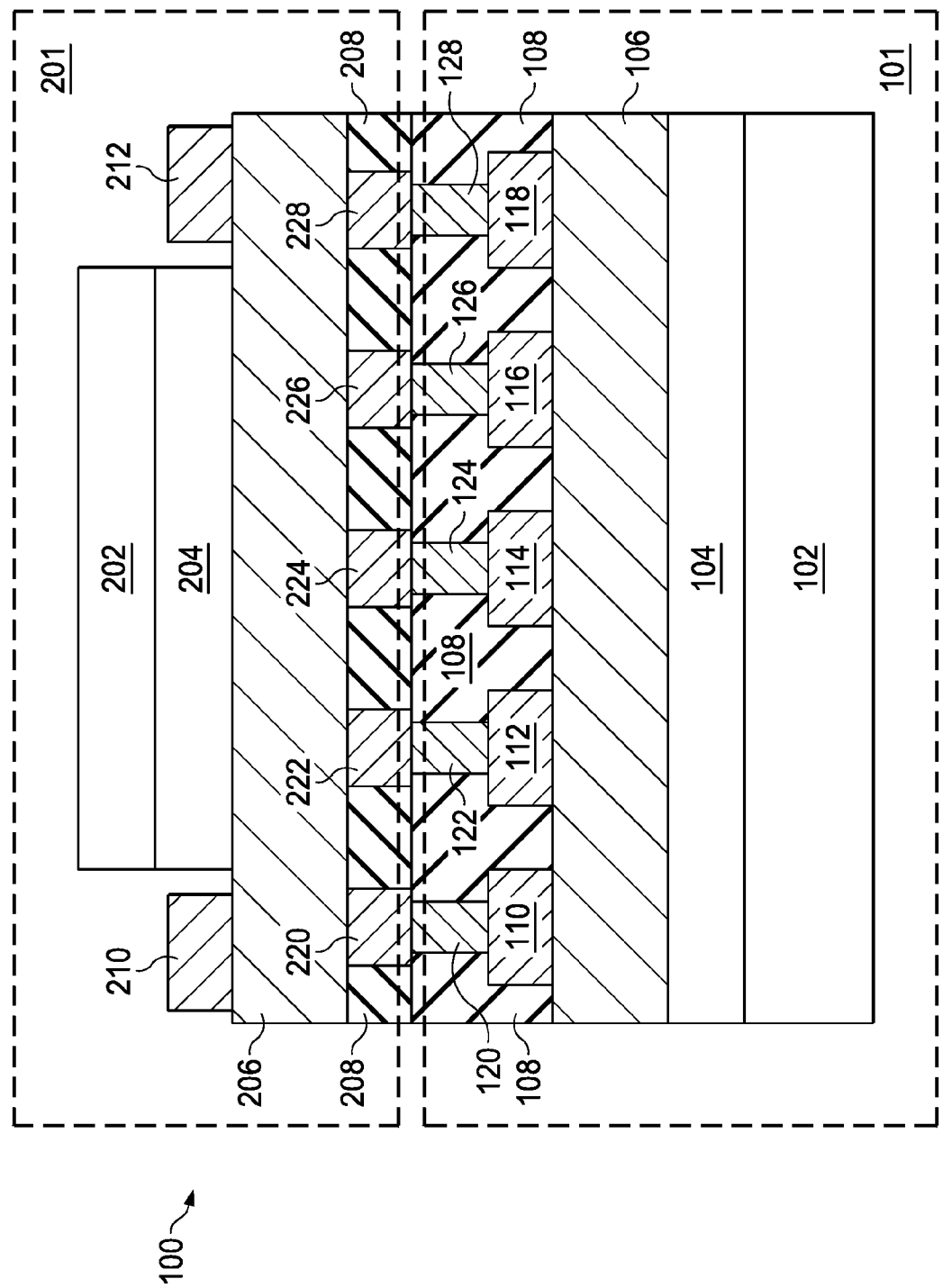
FIG. 1 illustrates a cross sectional view of a stacked semiconductor device in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross sectional view of a stacked semiconductor device in accordance with various embodiments of the present disclosure. As shown in FIG. 1, a second chip 201 is stacked on top of a first chip 101. A plurality of first bonding pads 120, 122, 124, 126 and 128 are formed in the first chip 101. Likewise, a plurality of second bonding pads 220, 222, 224, 226 and 228 are formed in the second chip 201. Furthermore, the bonding pads located at the second chip 201 (e.g., bonding pad 220) are aligned face-to-face with their corresponding bonding pads located at the first chip 101 (e.g., bonding pad 120). The first chip 101 and the second chip 201 are bonded together through suitable bonding techniques such as hybrid bonding. The hybrid bonding process will be described below with respect to FIG. 12.

It should be noted that the number of bonding pads (e.g., first bonding pad 120 and second bonding pad 220) shown in FIG. 1 is merely an example. A person skilled in the art will recognize that the stacked semiconductor device 100 may accommodate any number of bonding pads.

As shown in FIG. 1, the first chip 101 comprises a first substrate 102, first active circuits 104 and a first interconnect structure 106. Likewise, the second chip 201 comprises a second substrate 202, second active circuits 204 and a second interconnect structure 206. In addition, in order to bond the second chip 201 on the first chip 101, a first dielectric layer 108 is formed over the first interconnect structure 106 and a second dielectric layer 208 is formed over the second interconnect structure 206. The first chip 101 and the second chip 201 are bonded together through the bonding pads formed in the dielectric layers. The detailed bonding process will be described below with respect to FIGS. 4-13.

Throughout the description, the side of the semiconductor chips (e.g., first chip 101) having active circuits (e.g., first active circuits 104) is alternatively referred to as the front side of the semiconductor chips. The opposite side is referred to as the backside of the semiconductor chips.

In accordance with some embodiments, the first chip 101 and the second chip 201 may be produced by different semiconductor foundries. For example, the first chip 101 is provided by a first foundry. As shown in FIG. 1, the first foundry has mounted a plurality of first connection pads 110, 112, 114, 116 and 118 on the front side of the first chip 101. A second foundry forms the plurality of first bonding pads 120, 122, 124, 126 and 128 on the front side of the first chip 101 based upon the pattern of the first connection pads 110, 112, 114, 116 and 118.

The second chip 201 is provided by the second foundry. As described above, there may be a plurality of second bonding pads formed on the second chip 201. More particularly, the second chip 201 is configured such that the second bonding pads (e.g., second bonding pad 220) are aligned face-to-face with their corresponding first bonding pads (e.g., first bonding pad 120).

After the second chip 201 is stacked on the first chip 101, a plurality of second connection pads 210 and 212 may be formed on a backside of the second chip 201. In some embodiments, both the first connection pads and the second connection pads are formed of aluminum. As shown in FIG. 1, the second connection pads 210 and 212 are electrically coupled to the first connection pads 110, 112, 114, 116 and 118 through the bonding pads (e.g., bonding pads 220 and 120).

Figure 2:
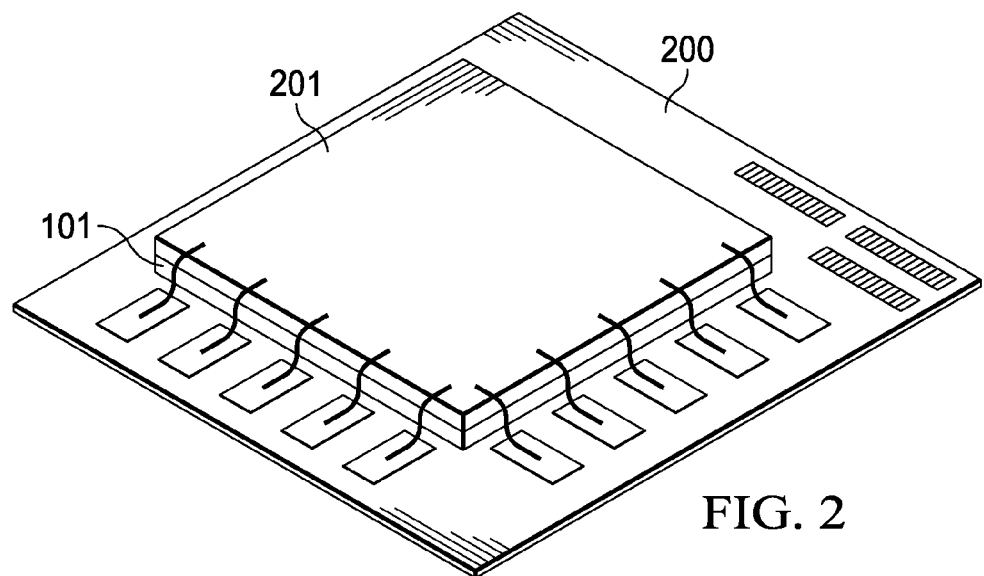
FIG. 2 illustrates a perspective view of the stacked semiconductor device shown in FIG. 1 after the stacked semiconductor device is mounted on a printed circuit board in accordance with various embodiments of the present disclosure.

FIG. 2 illustrates a perspective view of the stacked semiconductor device shown in FIG. 1 after the stacked semiconductor device is mounted on a printed circuit board in accordance with various embodiments of the present disclosure. As described above with respect to FIG. 1, there may be a plurality of second connection pads formed on the backside of the second chip 201. In some embodiments, the stacked semiconductor device 100 is picked and mounted on the printed circuit board 200 as shown in FIG. 2. The second connection pads on the second chip 201 may be wire bonded to the input and output pads of the printed circuit board 200 as shown in FIG. 2.

It should be noted while FIG. 2 illustrates two stacked chips (e.g., first chip 101 and second chip 201), this is merely an example. Likewise, the use of wire bonding shown in FIG. 2 is merely illustrative and other approaches for electrically connecting the stacked chips are within the contemplated scope of the present disclosure.

One advantageous feature of having the stacked semiconductor device 100 shown in FIGS. 1-2 is that the bonding structure of the stacked semiconductor device 100 may be used to bond semiconductor chips produced by different semiconductor foundries. As such, the packaging and assembly cost may be reduced. Furthermore, the footprint of the semiconductor device may be reduced by stacking two chips together.

Figure 3:
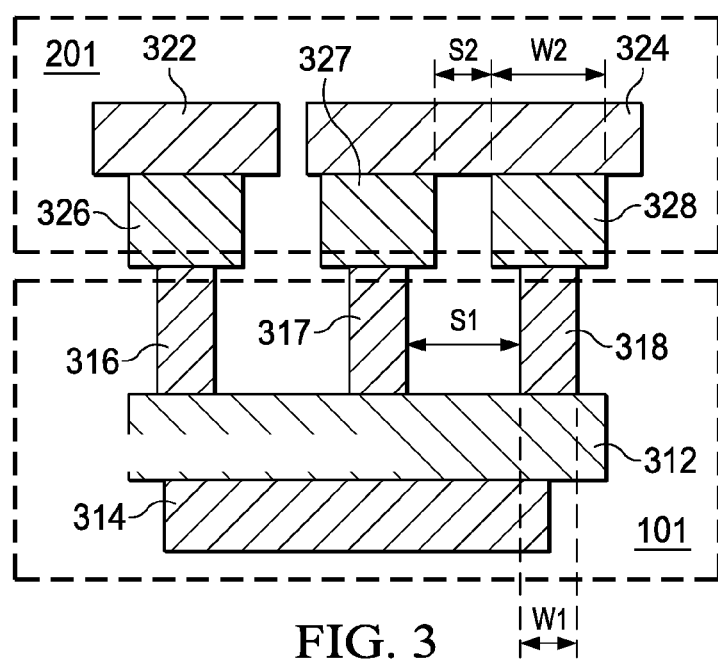
FIG. 3 illustrates in detail a cross sectional view of the bonding structure shown in FIG. 1 in accordance with various embodiments of the present disclosure.

FIG. 3 illustrates in detail a cross sectional view of the bonding structure shown in FIG. 1 in accordance with various embodiments of the present disclosure. As shown in FIG. 3, the second chip 201 may comprise three bonding pads 326, 327 and 328. The bonding pad 326 is electrically coupled to a metal line 322. The bonding pads 327 and 328 are electrically coupled to a metal line 324. Metal lines 322 and 324 are formed in the second interconnect structure 206 (shown in FIG. 1).

The first chip 101 may comprise three bonding pads 316, 317 and 318. The bonding pads 316, 317 and 318 may be electrically coupled to a metal line 314 through a connection pad 312. The metal line 314 is formed in the first interconnect structure 106 (shown in FIG. 1).

As shown in FIG. 3, the distance between two adjacent first bonding pads (e.g., bonding pads 317 and 318) is defined as S1. The distance between two adjacent bonding pads (e.g., bonding pads 327 and 328) is defined as S2. The width of the second bonding pads (e.g., bonding pad 328) is defined as W2. The width of the first bonding pads (e.g., bonding pad 318) is defined as W1. In some embodiments, W2 is greater than W1. W2 is less than 5 um. The ratio of S1 to W1 is greater than 4. The ratio of S2 to W2 is greater than 4.

FIGS. 4-13 illustrate intermediate steps of fabricating the stacked semiconductor device shown in FIG. 1 in accordance with various embodiments of the present disclosure. It should be noted that the fabrication steps as well as the stacked semiconductor device shown in FIGS. 4-13 are merely an example. A person skilled in the art will recognize there may be many alternatives, variations and modifications.

Figure 4:
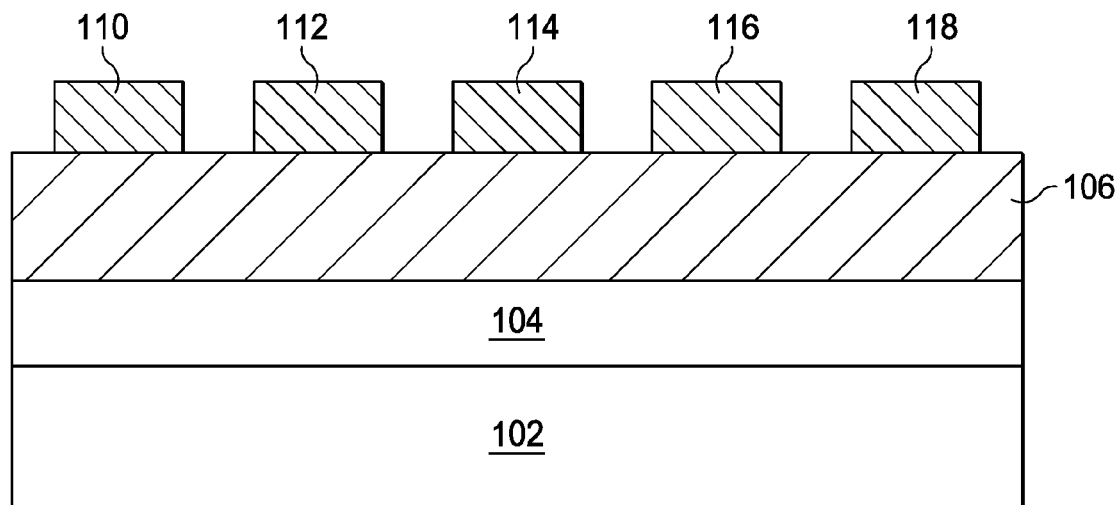
FIG. 4 illustrates a cross sectional view of a first chip in accordance with various embodiments of the present disclosure.

FIG. 4 illustrates a cross sectional view of a first chip in accordance with various embodiments of the present disclosure. The first chip 101 comprises a first substrate 102, first active circuits 104, a first interconnect structure 106 and a plurality of connection pads as shown in FIG. 4.

The first substrate 102 may be formed of silicon, although it may also be formed of other group III, group IV, and/or group V elements, such as silicon, germanium, gallium, arsenic, and combinations thereof. The substrate may comprise a bulk substrate or a silicon-on-insulator (SOI) substrate.

In some embodiments, the first chip 101 may be from a standard wafer having a thickness more than 100 um. In alternative embodiments, the first chip 101 may be of a thickness of about 770 um.

The first active circuits 104 are formed on the front side of the first substrate 102. The first active circuit 104 may be any type of circuitry suitable for a particular application. In some embodiments, the first active circuits 104 may include various n-type metal-oxide semiconductor (NMOS) and/or p-type metal-oxide semiconductor (PMOS) devices such as transistors, capacitors, resistors, diodes, photo-diodes, fuses and the like. The first active circuits 104 may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

The first interconnect structure 106 may comprise a plurality of inter-layer dielectric (ILD) layers and inter-metal dielectric (IMD) layers (not shown). The first interconnect structure 106 may further comprise a plurality of through vias (not shown).

In some embodiments, the first interconnect structure 106 may include an ILD layer, an IMD layer, a metal line and a redistribution layer. Throughout the description, the dielectric layer in which contact plugs are formed is referred to as an ILD layer, and the dielectric layers over the ILD are referred to as IMD layers. The metal lines are formed in the IMD layers. The redistribution layer is formed over the IMD layers.

This interconnect structure described above is merely an example, which should not unduly limit the scope of the claims. One of ordinary skill in the art would recognize many variations, alternatives, and modifications. For example, the interconnect structure may comprise a plurality of IMD layers.

The ILD layer may be formed, for example, of a low-K dielectric material, such as silicon oxide, phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof or the like, by any suitable method known in the art, such as spinning, chemical vapor deposition (CVD), plasma chemical vapor deposition (PECVD) and/or the like.

One or more IMD layers and the associated metal lines (not shown) are formed over the ILD layer. Generally, the one or more IMD layers and the associated metal lines are used to interconnect the electrical circuitry to each other and to provide an external electrical connection. The IMD layers are preferably formed of a low-K dielectric material, such as fluorosilicate glass (FSG) formed by PECVD techniques or high-density plasma chemical vapor deposition (HDPCVD) or the like.

The metal lines may be formed of metal materials such as copper, copper alloys, aluminum, silver, gold, any combinations thereof and/or the like. The metal lines may be formed by a dual damascene process, although other suitable techniques such as deposition, single damascene may alternatively be used. The dual damascene process is well known in the art, and hence is not discussed herein.

The redistribution layer may be a single material layer, or a multi-layered structure and may be made of metals such as titanium, titanium nitride, aluminum, tantalum, copper and combinations thereof. The redistribution layer may be made by any suitable method known in the art such as PVD, sputter, CVD, electroplating and/or the like.

One skilled in the art will recognize that the interconnect structure may comprise more inter-metal dielectric layers and the associated metal lines and plugs. In particular, the layers between the metallization layers may be formed by alternating layers of dielectric (e.g., extremely low-k dielectric material) and conductive materials (e.g., copper).

Figure 5:
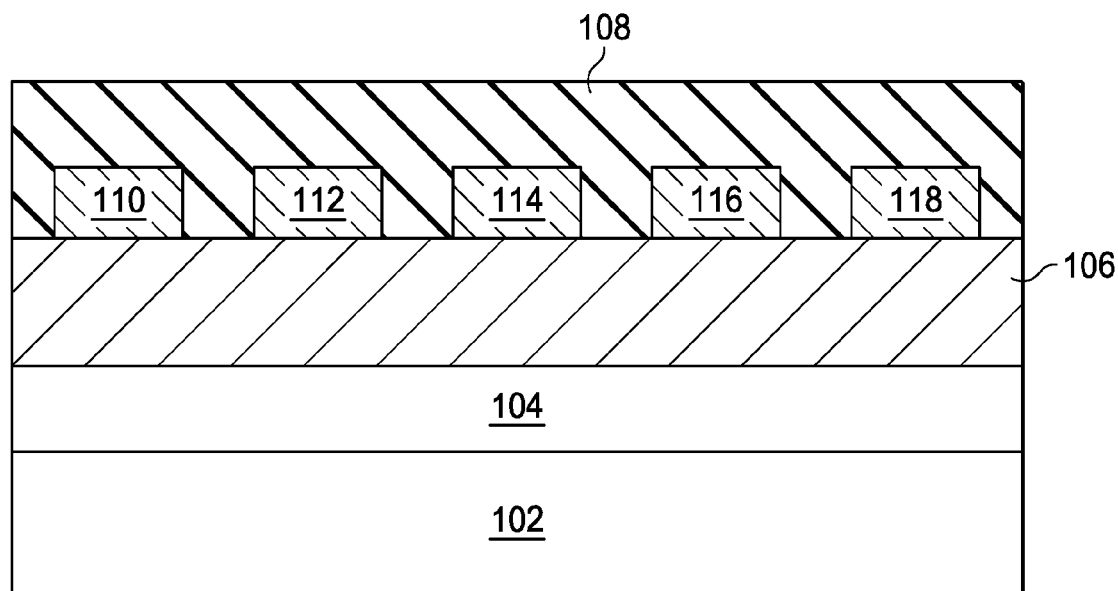
FIG. 5 illustrates a cross sectional view of the semiconductor device shown in FIG. 4 after a first dielectric layer is deposited over the first chip in accordance with various embodiments of the present disclosure.

FIG. 5 illustrates a cross sectional view of the semiconductor device shown in FIG. 4 after a first dielectric layer is deposited over the first chip in accordance with various embodiments of the present disclosure. The first dielectric layer 108 may be formed of any suitable dielectric materials such as a low-K dielectric and/or the like. The first dielectric layer 108 may be formed by suitable deposition techniques such as PECVD and/or the like. As shown in FIG. 5, once the first dielectric layer 108 is deposited on the first chip 101, the first connection pads 110, 112, 114, 116 and 118 are embedded in the first dielectric layer 108.

Figure 6:
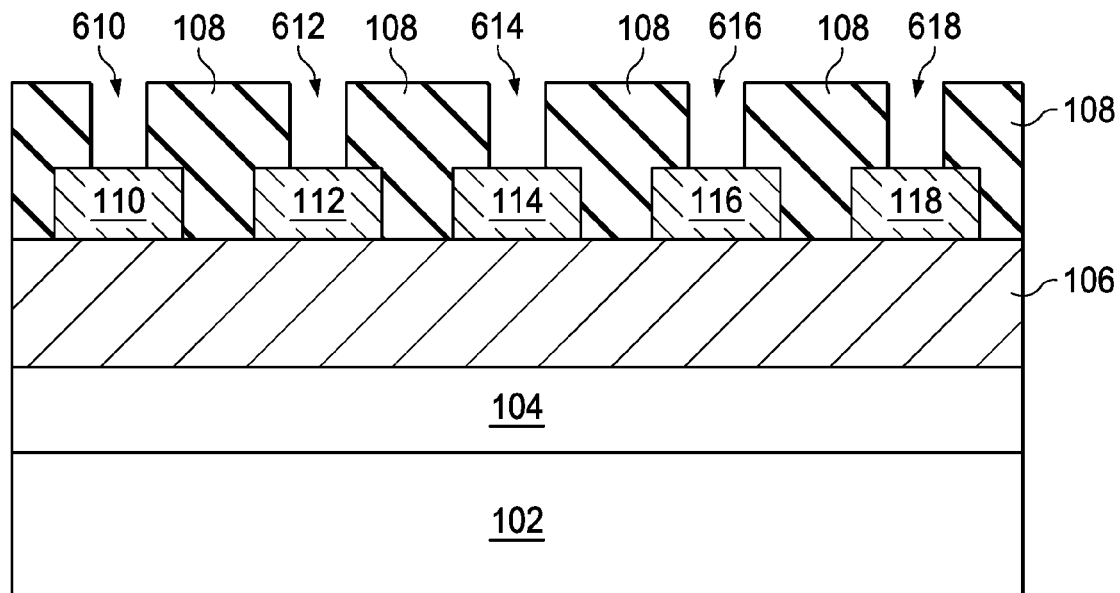
FIG. 6 illustrates a cross sectional view of the semiconductor device shown in FIG. 5 after a plurality of openings are formed in the first dielectric layer in accordance with various embodiments of the present disclosure.

FIG. 6 illustrates a cross sectional view of the semiconductor device shown in FIG. 5 after a plurality of openings are formed in the first dielectric layer in accordance with various embodiments of the present disclosure. According to the locations of the connection pads 110, 112, 114, 116 and 118, a plurality of openings 610, 612, 614, 616 and 618 are formed in the first dielectric layer 108. The openings may be formed by any suitable semiconductor patterning techniques such as an etching process, a laser ablation process and/or the like. For example, the openings may be formed by using photolithography techniques to deposit and pattern a photoresist material on the first dielectric layer 108. A portion of the photoresist is exposed according to the locations of the connection pads shown in FIG. 6. An etching process, such as an anisotropic dry etch process, may be used to create the openings in the first dielectric layer 108.

Figure 7:
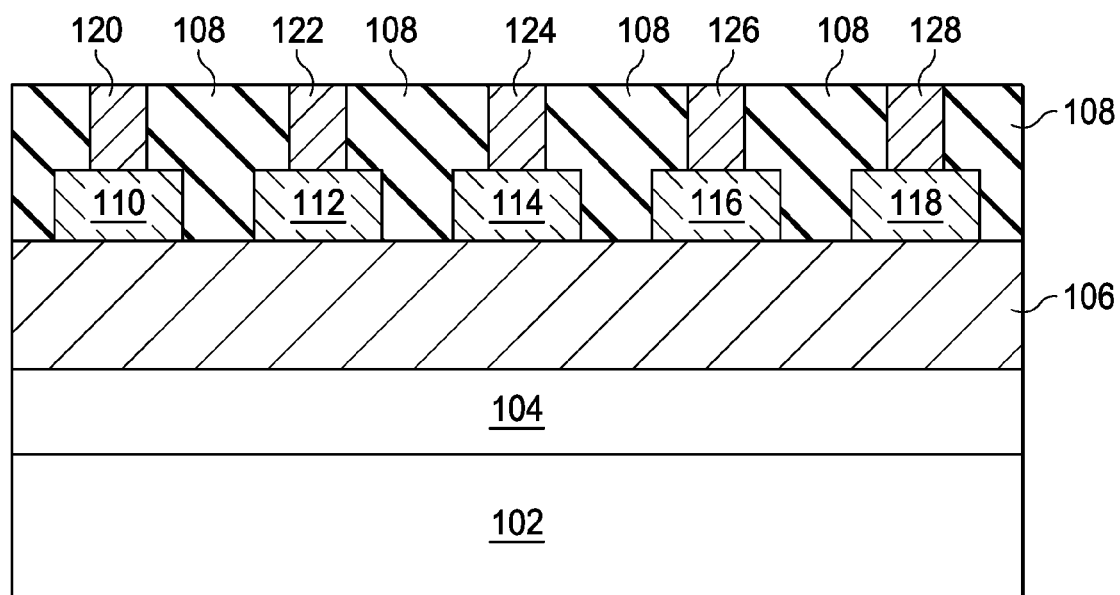
FIG. 7 illustrates a cross sectional view of the semiconductor device shown in FIG. 6 after a conductive material is filled in the openings in accordance with various embodiments of the present disclosure.

FIG. 7 illustrates a cross sectional view of the semiconductor device shown in FIG. 6 after a conductive material is filled in the openings in accordance with various embodiments of the present disclosure. A conductive material may be filled in the openings. The conductive material may be copper, but can be any suitable conductive materials, such as copper alloys, aluminum, titanium, silver, any combinations thereof and/or the like. The conductive material may be formed by suitable techniques such as an electro-less plating process, CVD, electroplating and/or the like.

A planarization process may be performed to remove excess conductive materials to form the first bonding pads as shown in FIG. 7. The planarization process may be implemented by using suitable techniques such as grinding, polishing and/or chemical etching, a combination of etching and grinding techniques.

In accordance with various embodiments, the planarization process may be implemented by using a chemical mechanical polish (CMP) process. In the CMP process, a combination of etching materials and abrading materials are put into contact with the top surface of the semiconductor device and a grinding pad (not shown) is used to grind away excess conductive materials until the first dielectric layer 108 is exposed as shown in FIG. 7.

Figure 8:
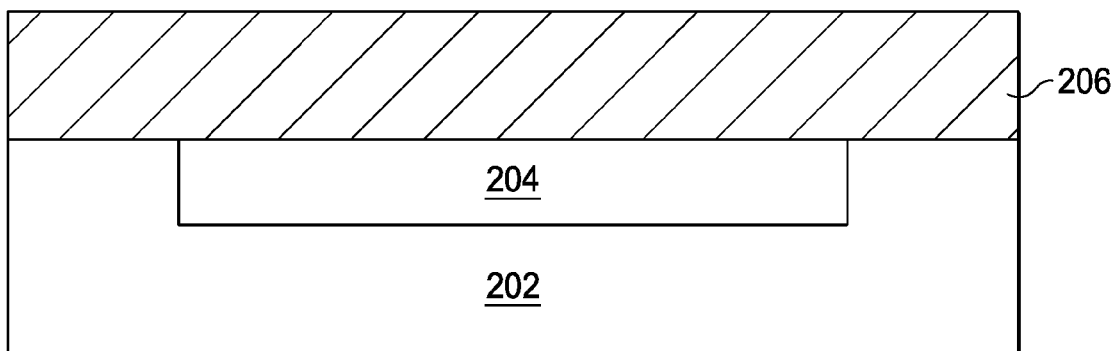
FIG. 8 illustrates a cross sectional view of a second chip in accordance with various embodiments of the present disclosure.

FIG. 8 illustrates a cross sectional view of a second chip in accordance with various embodiments of the present disclosure. As shown in FIG. 8, the second chip 201 comprises a second substrate 202, second active circuits 204 and a second interconnect structure 206. The structure of the second chip 201 is similar to that of the first chip 101, and hence is not discussed in further detail herein to avoid repetition.

It should be noted that in some embodiments, the width of the second interconnect structure 206 is greater than the width of the second active circuits 204 as shown in FIG. 8. In other words, the second active circuits 204 only occupy a portion of the top surface of the second substrate 202. Such an arrangement of the second active circuits 204 helps to reduce the cost of the second chip 201.

Figure 9:
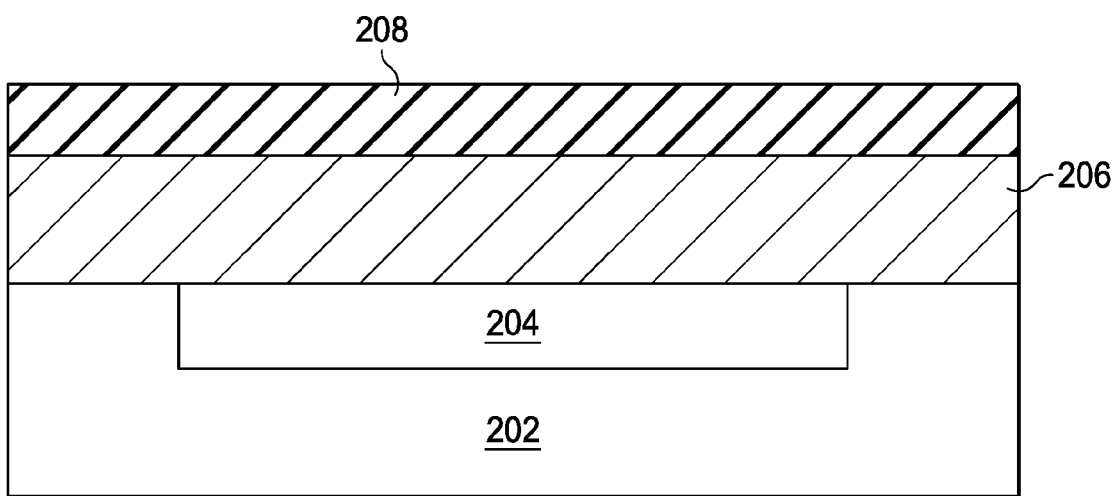
FIG. 9 illustrates a cross sectional view of the semiconductor device shown in FIG. 8 after a second dielectric layer is deposited over the second chip in accordance with various embodiments of the present disclosure.

FIG. 9 illustrates a cross sectional view of the semiconductor device shown in FIG. 8 after a second dielectric layer is deposited over the second chip in accordance with various embodiments of the present disclosure. The formation process of the second dielectric layer 208 is similar to that of the first dielectric layer 108 described above with respect to FIG. 5, and hence is not discussed again to avoid repetition.

Figure 10:
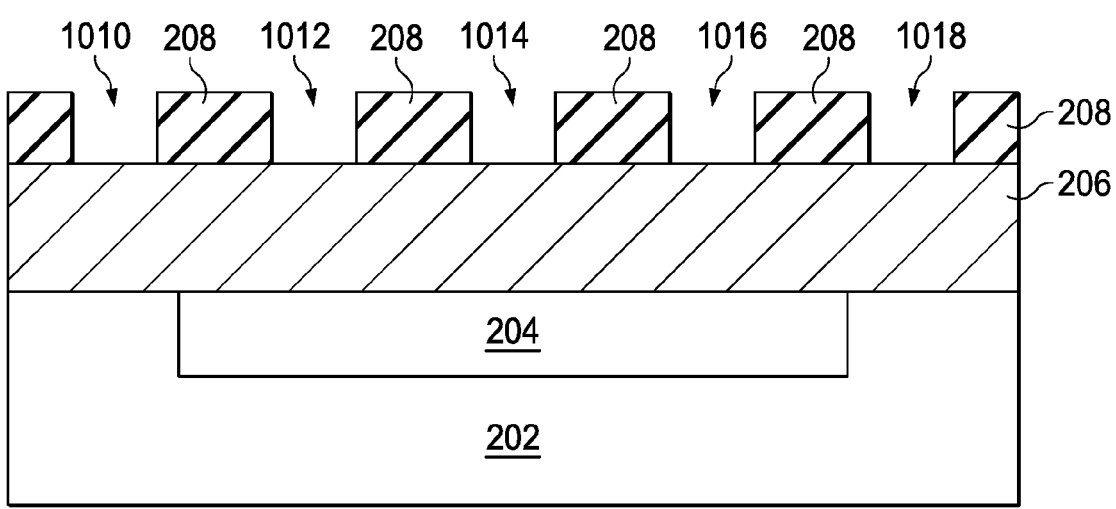
FIG. 10 illustrates a cross sectional view of the semiconductor device shown in FIG. 9 after a plurality of openings are formed in the second dielectric layer in accordance with various embodiments of the present disclosure.

FIG. 10 illustrates a cross sectional view of the semiconductor device shown in FIG. 9 after a plurality of openings are formed in the second dielectric layer in accordance with various embodiments of the present disclosure. According to the locations of the first bonding pads shown in FIG. 7, a plurality of openings 1010, 1012, 1014, 1016 and 1018 are formed in the second dielectric layer 208. The formation process of the openings shown in FIG. 10 is similar to that of the openings shown in FIG. 6, and hence is not discussed again to avoid repetition.

Figure 11:
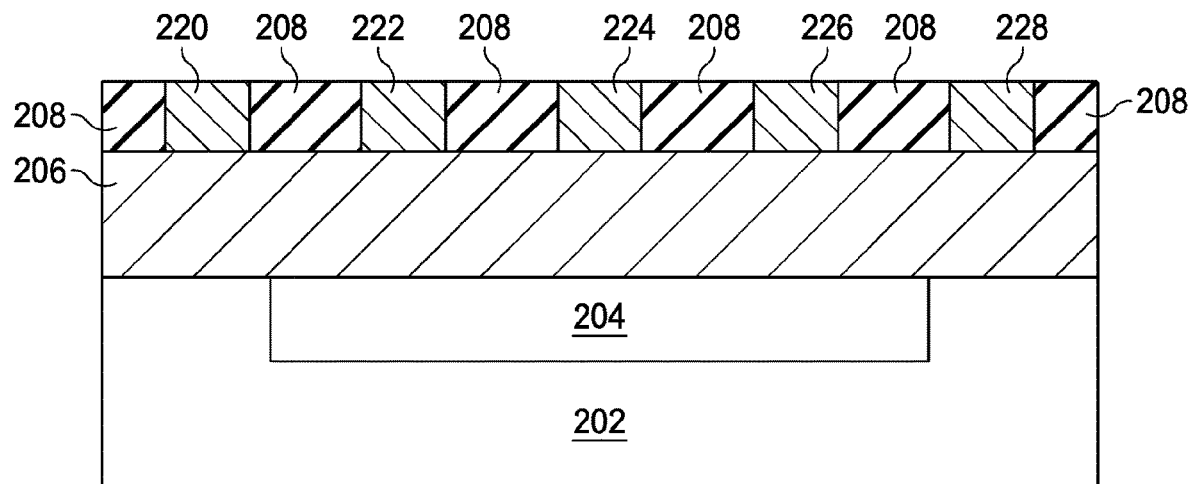
FIG. 11 illustrates a cross sectional view of the semiconductor device shown in FIG. 10 after a conductive material is filled in the openings in accordance with various embodiments of the present disclosure.

FIG. 11 illustrates a cross sectional view of the semiconductor device shown in FIG. 10 after a conductive material is filled in the openings in accordance with various embodiments of the present disclosure. A conductive material may be filled in the openings. The conductive material may be copper, but can be any suitable conductive materials, such as copper alloys, aluminum, titanium, silver, any combinations thereof and/or the like. The conductive material may be formed by suitable techniques such as an electro-less plating process, CVD, electroplating and/or the like.

A planarization process is performed to remove excess conductive materials to form the second bonding pads as shown in FIG. 11. The planarization process may be implemented by using suitable techniques such as grinding, polishing and/or chemical etching, a combination of etching and grinding techniques.

In accordance with various embodiments, the planarization process may be implemented by using a CMP process. In the CMP process, a combination of etching materials and abrading materials are put into contact with the top surface of the semiconductor device and a grinding pad (not shown) is used to grind away excess conductive materials until the second dielectric layer 208 is exposed as shown in FIG. 11.

Figure 12:
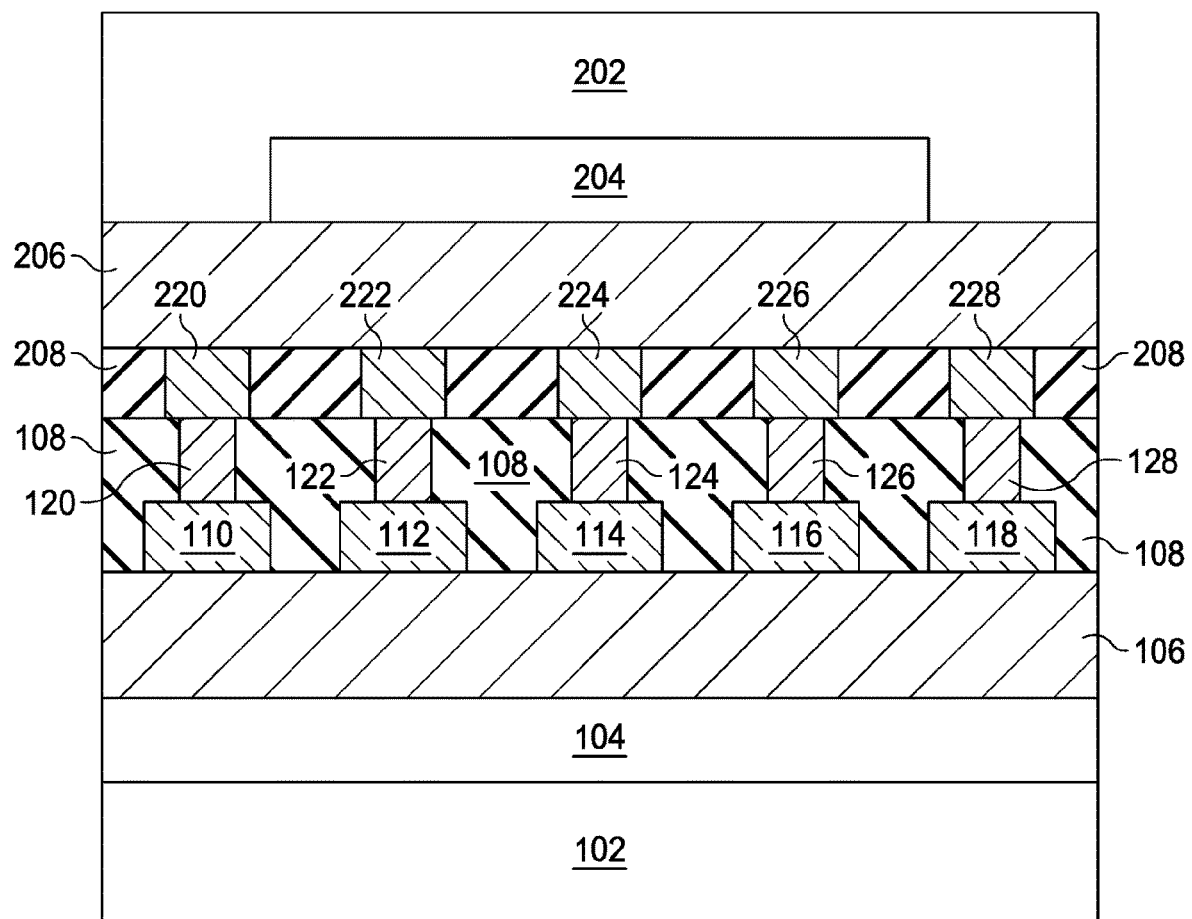
FIG. 12 is a cross sectional view of the semiconductor device shown in FIG. 11 after the second chip is flipped and bonded on the first chip in accordance with various embodiments of the present disclosure.

FIG. 12 is a cross sectional view of the semiconductor device shown in FIG. 11 after the second chip is flipped and bonded on the first chip in accordance with various embodiments of the present disclosure. Once the second bonding pads are formed in the second chip 201, the second chip 201 is flipped and further bounded on the first chip 101 as shown in FIG. 12. In particular, the front side of the second chip 201 may face up toward the front side of the first chip 101.

Various bonding techniques may be employed to achieve bonding between the first chip 101 and the second chip 201. In accordance with an embodiment, suitable bonding techniques may include direct bonding, hybrid bonding and the like. In accordance with an embodiment, a hybrid bonding process may be employed to bond the first chip 101 and the second chip 201 together. More particularly, through a bonding structure such a bonding chuck (not shown), the second chip 201 is stacked on top of the first chip 101 in a chamber (not shown). In particular, the bonding pads (e.g., bonding pad 220) of the second chip 201 are aligned face-to-face with their corresponding bonding pads (e.g., bonding pad 120) located at the first chip 101.

A thermal process may be performed on the stacked chip structure. Such a thermal process may lead to copper inter-diffusion. More particularly, the copper atoms of the bonding pads (e.g., bonding pads 120 and 220) acquire enough energy to diffuse between two adjacent bonding pads. As a result, a homogeneous copper layer is formed between two adjacent bonding pads. Such a homogeneous copper layer helps the bonding pads (e.g., bonding pads 120 and 220) form a uniform bonded feature. The uniform bonded feature establishes a conductive path between the first chip 101 and the second chip 201. In addition, the uniform bonded feature also provides a mechanical bond to hold the first chip 101 and the second chip 201.

A post bonding anneal process may be performed on the stacked semiconductor structure in a chamber with inert gases such as argon, nitrogen, helium and the like. The stacked semiconductor structure is baked for approximately from thirty minutes to three hours at a temperature more than 300 degrees. As a result, the bonding pads of the first chip 101 and the bonding pads of the second chip 201 are reliably bonded together through the post bonding anneal process.

Figure 13:
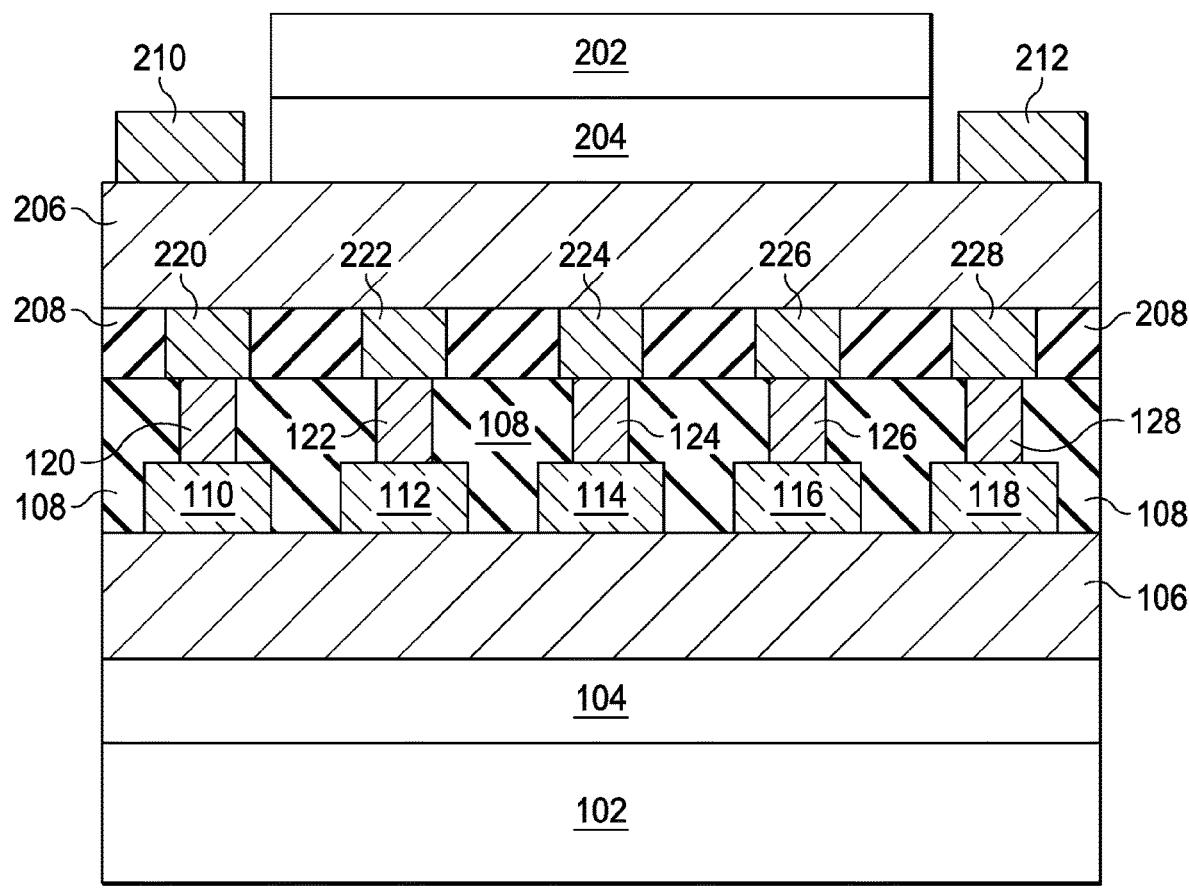
FIG. 13 is a cross sectional view of the stacked semiconductor device illustrated in FIG. 12 after a thinning process has been applied to the backside of the second chip in accordance with various embodiments of the present disclosure.
Figure 14:
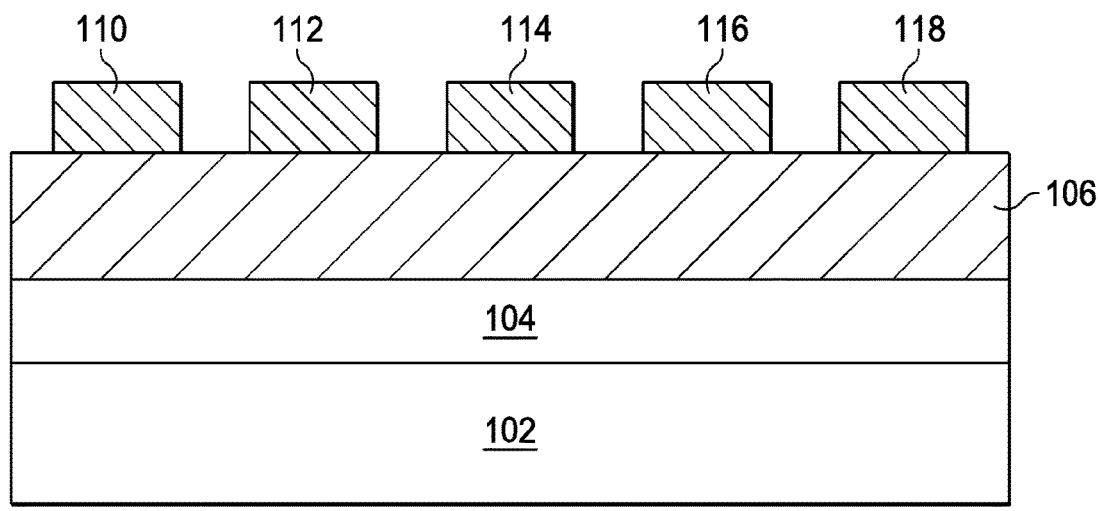
FIGS. 14-26 illustrate intermediate steps of fabricating another stacked semiconductor device similar to that shown in FIG. 1 in accordance with various embodiments of the present disclosure.

FIG. 13 is a cross sectional view of the stacked semiconductor device illustrated in FIG. 12 after a thinning process has been applied to the backside of the second chip in accordance with various embodiments of the present disclosure. The backside of the second chip 201 undergoes a thinning process. The thinning process can employ a mechanical grinding process, a chemical polishing process, an etching process and/or the like. By employing the thinning process, in some embodiments, the backside of the second chip 201 can be ground so that the second chip 201 may have a thickness of approximately sub-100 um.

In addition, portions of the second substrate 202 have been removed in order to mount the second connection pads on the second chip 201. More particularly, second connection pads 210 and 212 are formed on the second interconnect structure 206 as shown in FIG. 13. In some embodiments the second connection pads 210 and 212 are electrically coupled to the first active circuits 104 through the bonding pads as well as the interconnect structures.

FIGS. 14-26 illustrate intermediate steps of fabricating another stacked semiconductor device similar to that shown in FIG. 1 in accordance with various embodiments of the present disclosure. The fabrication steps shown in FIGS. 14-26 are similar to those shown in FIGS. 4-13 except that there may be a tungsten connector formed between the connection pads (e.g., connection pad 110) and the first bonding pads (e.g., bonding pad 120). The fabrication steps shown in FIGS. 14-15 and 21-26 are similar to those shown in FIGS. 4-5 and 8-13, and hence are not discussed again herein to avoid repetition.

Figure 15:
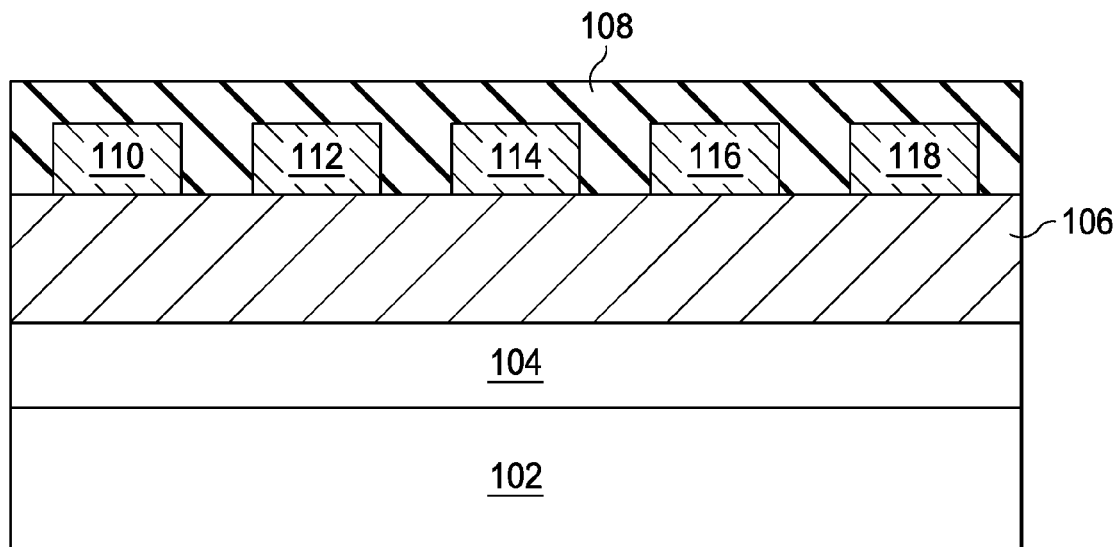
Figure 16:
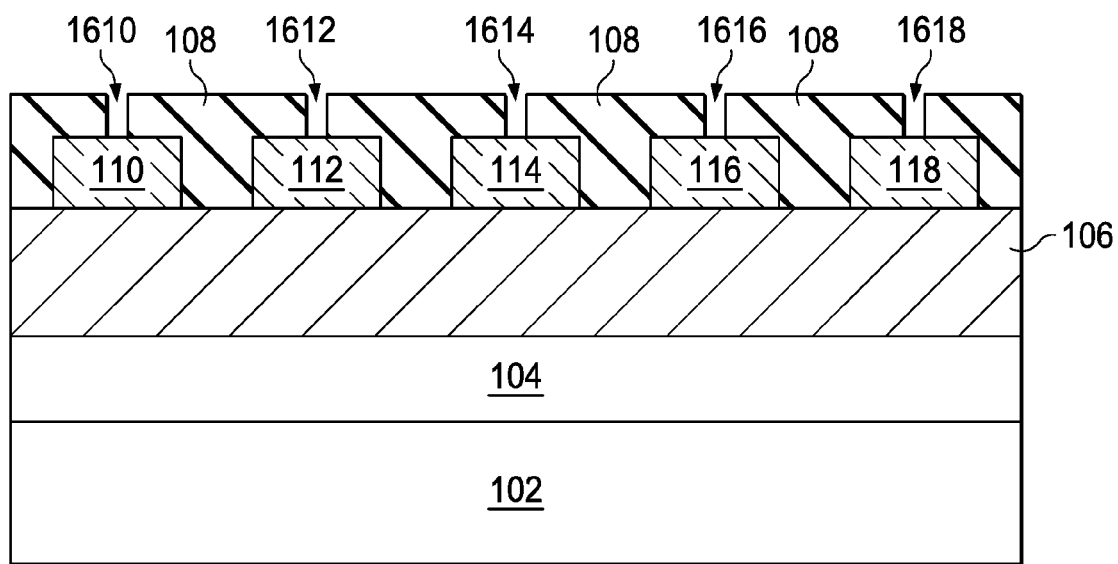

FIG. 16 illustrates a cross sectional view of the semiconductor device shown in FIG. 15 after a plurality of openings are formed in the first dielectric layer in accordance with various embodiments of the present disclosure. A plurality of openings 1610, 1612, 1614, 1616 and 1618 are formed in the first dielectric layer 108. The openings may be formed by any suitable semiconductor patterning techniques such as an etching process, a laser ablation process and/or the like.

Figure 17:
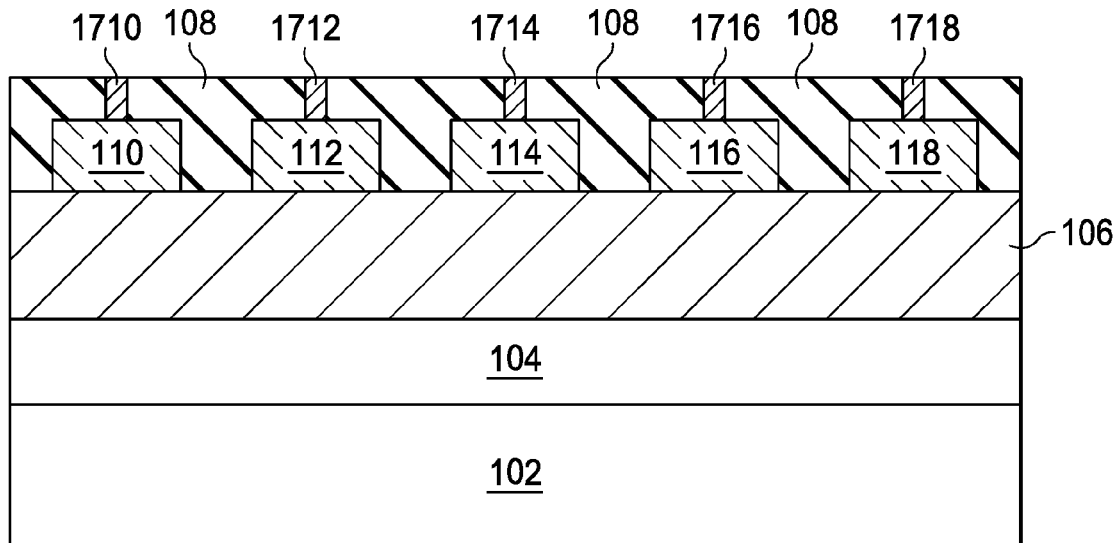

FIG. 17 illustrates a cross sectional view of the semiconductor device shown in FIG. 16 after a conductive material is filled in the openings in accordance with various embodiments of the present disclosure. A conductive material may be filled in the openings. The conductive material may be tungsten, but can be any suitable conductive materials. The conductive material may be formed by suitable techniques such as CVD and/or the like.

A planarization process may be performed to remove excess conductive materials to form tungsten connectors 1710, 1712, 1714, 1716 and 1718 as shown in FIG. 17. The planarization process may be implemented by using suitable techniques such as grinding, polishing and/or chemical etching, a combination of etching and grinding techniques. In accordance with various embodiments, the planarization process may be implemented by using a CMP process.

Figure 18:
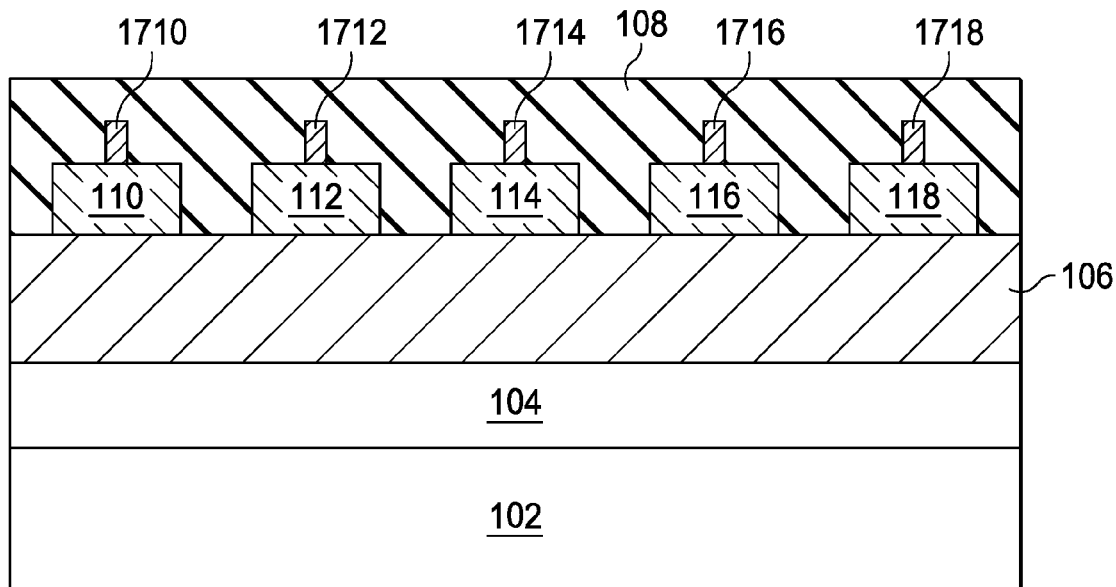

FIG. 18 illustrates a cross sectional view of the semiconductor device shown in FIG. 17 after a dielectric material is deposited over the semiconductor device in accordance with various embodiments of the present disclosure. The dielectric material may be the same as that of the first dielectric layer 108. The dielectric material may be deposited by suitable deposition techniques such as PECVD and/or the like.

Figure 19:
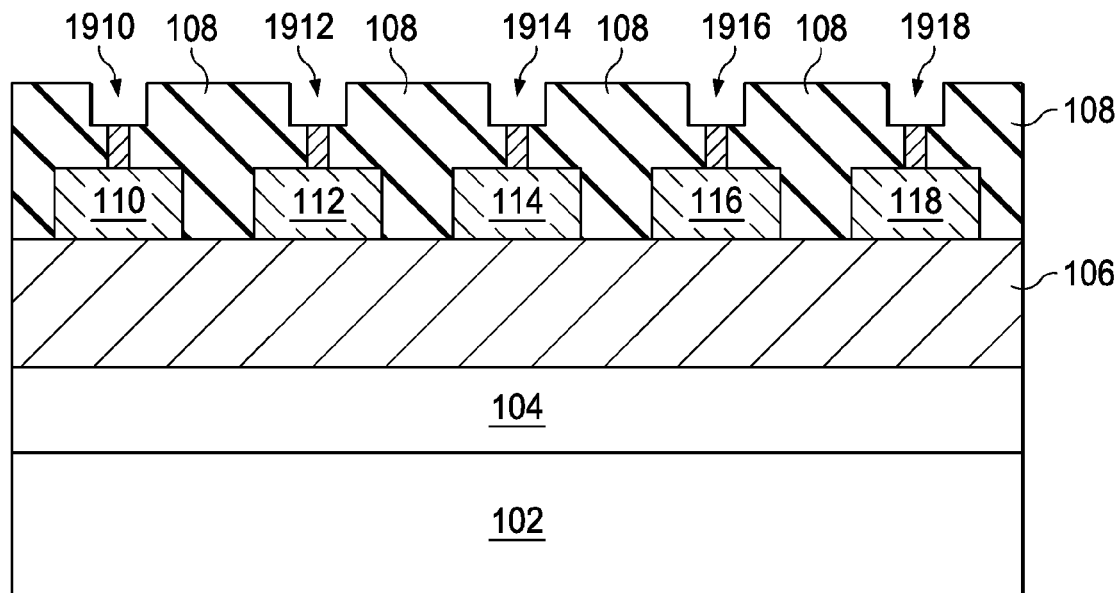

FIG. 19 illustrates a cross sectional view of the semiconductor device shown in FIG. 18 after a plurality of openings are formed in the first dielectric layer in accordance with various embodiments of the present disclosure. According to the locations of the tungsten connectors, a plurality of openings 1910, 1912, 1914, 1916 and 1918 are formed in the first dielectric layer 108. The openings may be formed by any suitable semiconductor patterning techniques such as an etching process, a laser ablation process and/or the like.

Figure 20:
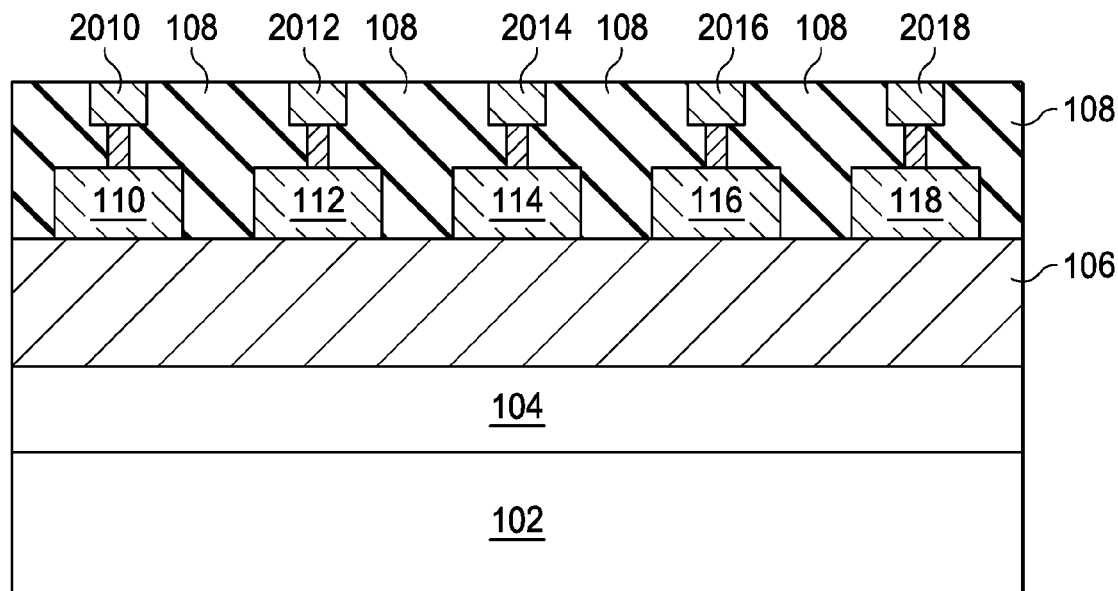
Figure 21:
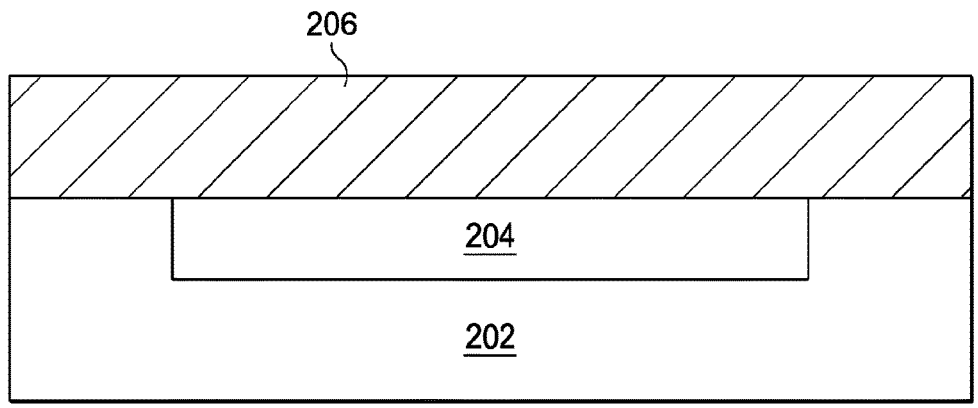
Figure 22:
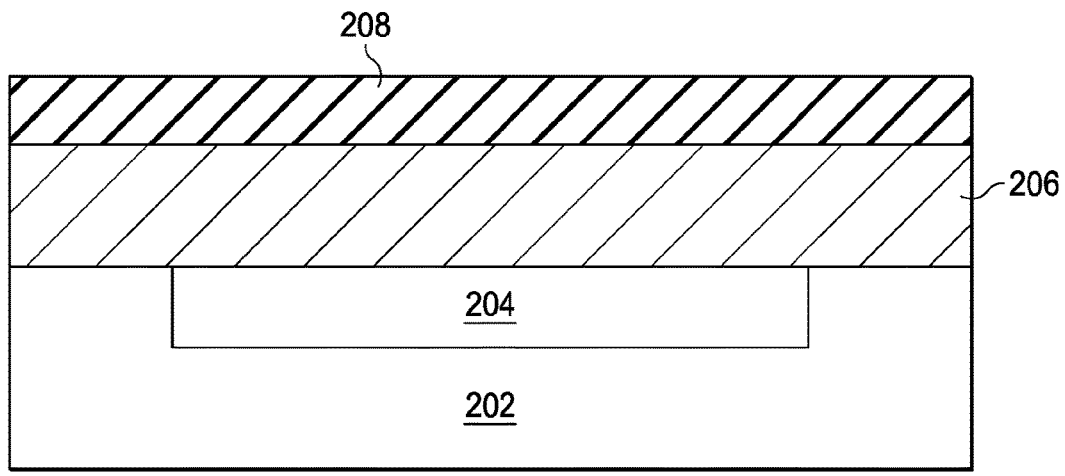
Figure 23:
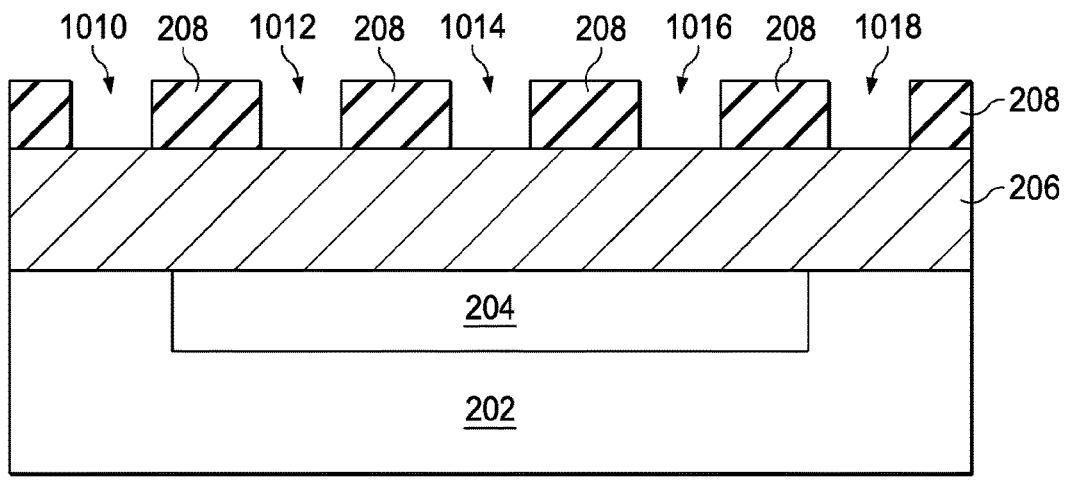
Figure 24:
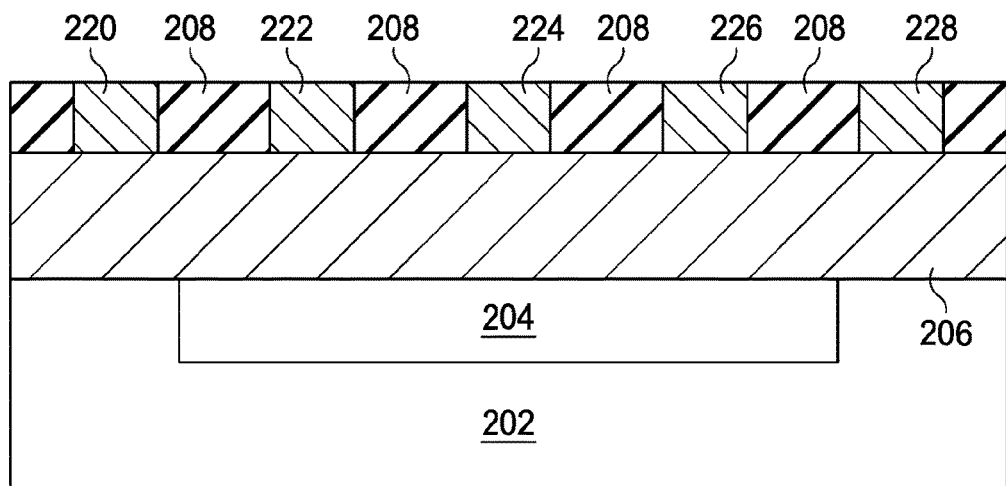
Figure 25:
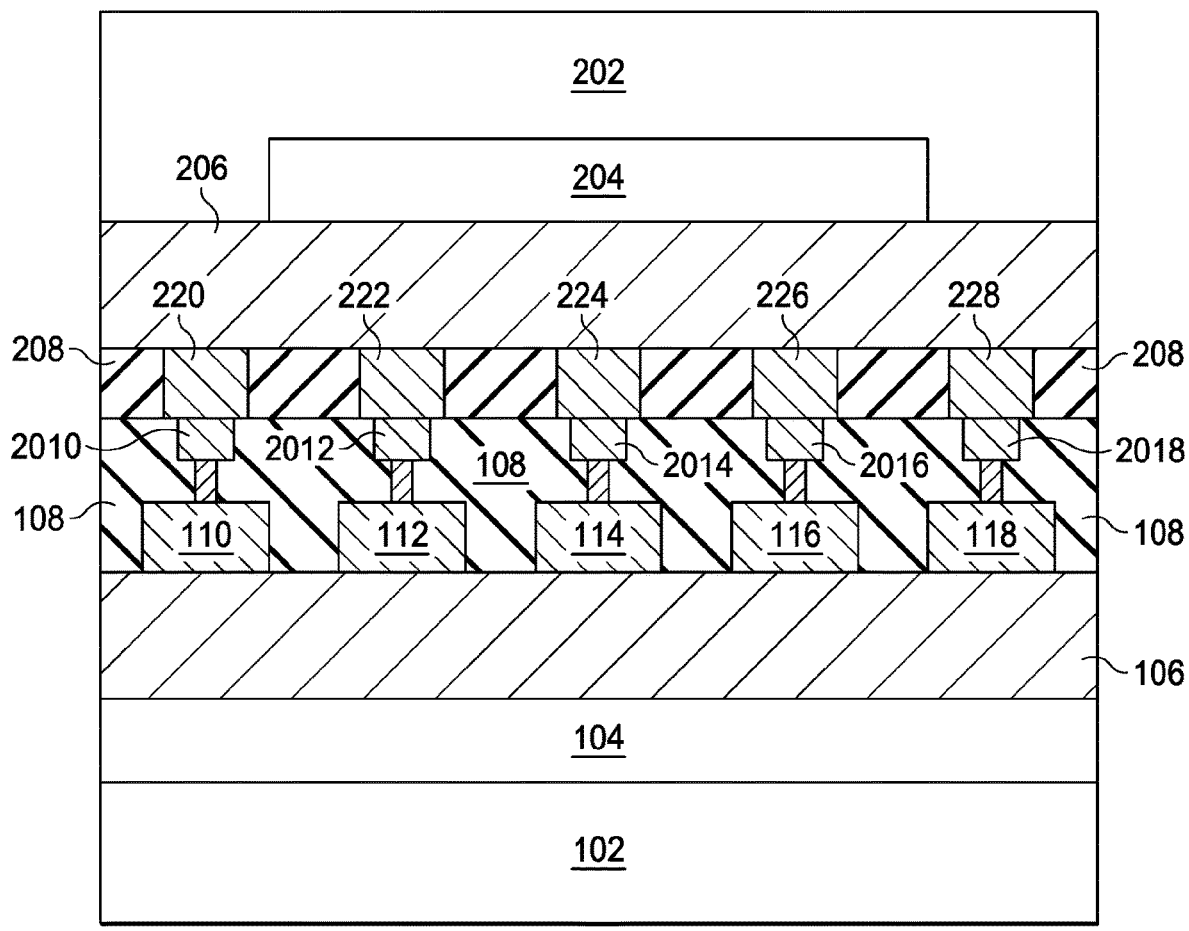
Figure 26:
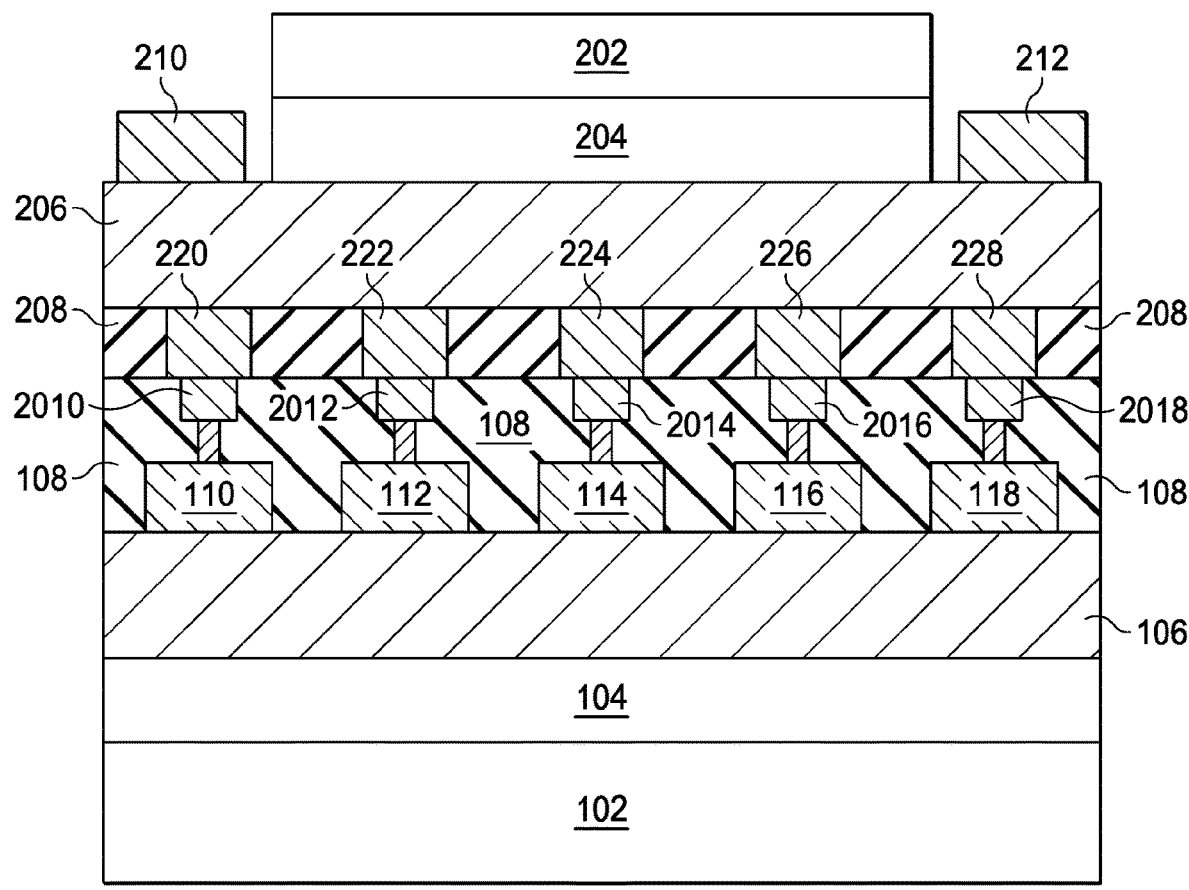

FIG. 20 illustrates a cross sectional view of the semiconductor device shown in FIG. 19 after a conductive material is filled in the openings in accordance with various embodiments of the present disclosure. A conductive material may be filled in the openings 1910, 1912, 1914, 1916 and 1918. The conductive material may be copper, but can be any suitable conductive materials, such as copper alloys, aluminum, titanium, silver, any combinations thereof and/or the like. The conductive material may be formed by suitable techniques such as an electro-less plating process, CVD, electroplating and/or the like.

A planarization process may be performed to remove excess conductive materials to form the first bonding pads 2010, 2012, 2014, 2016 and 2018 as shown in FIG. 20. The planarization process may be implemented by using suitable techniques such as grinding, polishing and/or chemical etching, a combination of etching and grinding techniques. In accordance with various embodiments, the planarization process may be implemented by using a CMP process.

In accordance with an embodiment, a device comprises a first chip comprising a first connection pad embedded in a first dielectric layer and a first bonding pad embedded in the first dielectric layer, wherein the first bonding pad comprises a first portion and a second portion, the second portion being in contact with the first connection pad and a second chip comprising a second bonding pad embedded in a second dielectric layer of the second chip, wherein the first chip and the second chip are face-to-face bonded together through the first bonding pad the second bonding pad.

In accordance with an embodiment, a device comprises a first chip comprising a first connection pad embedded in a first dielectric layer, a first bonding pad embedded in the first dielectric layer and a connector between the first connection pad and the first bonding pad and a second chip comprising a second bonding pad embedded in a second dielectric layer of the second chip, wherein the first chip and the second chip are face-to-face bonded together through the first bonding pad and the second bonding pad.

In accordance with an embodiment, a device comprises a first chip comprising a first connection pad embedded in a first dielectric layer and a first bonding pad embedded in the first dielectric layer, wherein the first bonding pad comprises a first portion and a second portion having different widths and a second chip comprising a second bonding pad embedded in a second dielectric layer of the second chip, wherein the first chip and the second chip are face-to-face bonded together through the first bonding pad and the second bonding pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first chip comprising:
      a first connection pad embedded in a first dielectric layer; and
      a first bonding pad embedded in the first dielectric layer, wherein the first bonding pad comprises a first portion and a second portion, the second portion being in contact with the first connection pad; and
   a second chip comprising:
      a second connection pad on a non-bonding side of the second chip, wherein a top surface of the second connection pad is lower than a backside of a substrate of the second chip; and
      a second bonding pad embedded in a second dielectric layer of the second chip, wherein the first chip and the second chip are face-to-face bonded together through the first bonding pad the second bonding pad.

2. The device of claim 1, wherein:
   a width of the first connection pad is greater than a width of the second portion of the first bonding pad; and
   a width of the first portion of the first bonding pad is greater than the width of the second portion of the first bonding pad.

3. The device of claim 1, wherein:
   a width of the second bonding pad is greater than a width of the first portion of the first bonding pad.

4. The device of claim 1, further comprising:
   a homogeneous layer between the first bonding pad and the second bonding pad, wherein the homogeneous layer is formed through an inter-diffusion process between the first bonding pad and the second bonding pad.

5. The device of claim 1, wherein:
   the second portion of the first bonding pad is a connector between the first portion of the first bonding pad and the first connection pad.

6. The device of claim 5, wherein:
   the connector is formed of tungsten.

7. A device comprising:
   a first chip comprising:
      a first substrate;
      a first interconnect structure over the first substrate;
      a first connection pad embedded in a first dielectric layer over the first interconnect structure;
      a first bonding pad embedded in the first dielectric layer; and
      a connector between the first connection pad and the first bonding pad; and a second chip comprising:
  a second substrate;
  a second interconnect structure over the second substrate; and
  a second bonding pad embedded in a second dielectric layer of the second chip, wherein the first chip and the second chip are face-to-face bonded together through the first bonding pad and the second bonding pad, and wherein the first interconnect structure and the second interconnect structure are face-to-face bonded together.

8. The device of claim 7, wherein:
a width of the first bonding pad is greater than a width of the connector; and
a width of the first connection pad is greater than the width of the connector.

9. The device of claim 7, further comprising:
a homogenous layer between the first bonding pad and the second bonding pad.

10. The device of claim 7, wherein:
the connector is in direct contact with the first bonding pad and the first connection pad.

11. The device of claim 7, wherein:
a width of the second bonding pad is greater than a width of the first bonding pad.

12. A device comprising:
a first chip comprising:
  a first connection pad embedded in a first dielectric layer; and
  a first bonding pad embedded in the first dielectric layer, wherein the first bonding pad comprises a first portion and a second portion having different widths; and
a second chip comprising a second bonding pad embedded in a second dielectric layer of the second chip, wherein the first chip and the second chip are face-to-face bonded together through the first bonding pad and the second bonding pad.

13. The device of claim 12, wherein:
a width of the first portion is greater than a width of the second portion.

14. The device of claim 12, wherein:
the second portion of the first bonding pad is between the first portion of the first bonding pad and the first connection pad.

15. The device of claim 12, wherein:
the first connection pad is formed of aluminum;
the second portion of the first bonding pad is a connector formed of tungsten;
the first portion of the first bonding pad is formed of copper; and
the second bonding pad is formed of copper.

16. The device of claim 12, further comprising:
a second connection pad and a third connection pad on a non-bonding side of the second chip.

17. The device of claim 16, wherein:
the second connection pad and the third connection pad are adjacent to sidewalls of a substrate of the second chip and on opposite sides of the substrate.

18. The device of claim 12, further comprising:
a homogenous layer between the first bonding pad and the second bonding pad.

19. The device of claim 1, wherein the second chip is mounted to a substrate, wherein the second connection pad is wire bonded to a contact on the substrate.

20. The device of claim 7, wherein the first dielectric layer is directly bonded to the second dielectric layer.

* * * * *